United States Patent [19]

Kendall

[11] Patent Number: 4,939,692

[45] Date of Patent: Jul. 3, 1990

[54] READ-ONLY MEMORY FOR MICROPROCESSOR SYSTEMS HAVING SHARED ADDRESS/DATA LINES

[75] Inventor: Terry L. Kendall, Newcastle, Calif.

[73] Assignee: Intel Corporation, Santa Clara, Calif.

[21] Appl. No.: 244,283

[22] Filed: Sep. 15, 1988

[51] Int. Cl.$^5$ ............................................. G11C 8/00
[52] U.S. Cl. .......................... 365/189.03; 365/230.08; 365/189.05
[58] Field of Search ....................... 365/230.08, 189.05; 371/51, 13

[56] References Cited

U.S. PATENT DOCUMENTS

| | | | |
|---|---|---|---|
| 4,396,845 | 8/1983 | Nakano | 365/230.08 |
| 4,443,864 | 4/1984 | McElroy | 365/230.08 |
| 4,460,982 | 7/1984 | Gee et al. | 365/185 |
| 4,513,420 | 4/1985 | Collins et al. | 371/51 |
| 4,535,455 | 8/1985 | Peterson | 371/13 |
| 4,545,038 | 10/1985 | Bellay et al. | 365/230.03 |
| 4,567,560 | 1/1986 | Polis et al. | 371/14 |
| 4,587,637 | 5/1986 | Ishizuka | 365/230.03 |
| 4,593,383 | 6/1986 | Armstrong et al. | 365/230.08 |
| 4,610,004 | 9/1986 | Moller et al. | 365/230.05 |
| 4,646,269 | 2/1987 | Wong et al. | 365/189.02 |
| 4,670,748 | 6/1987 | Williams | 365/230.08 |
| 4,691,298 | 9/1987 | Fukuda et al. | 365/230.03 |
| 4,715,017 | 12/1987 | Iwahashi | 365/239 |
| 4,725,945 | 2/1988 | Kronstadt et al. | 365/230.03 |
| 4,756,006 | 7/1988 | Rickard | 307/241 |

Primary Examiner—Glenn Gossage
Assistant Examiner—Michael A. Whitfield
Attorney, Agent, or Firm—Blakely, Sokoloff, Taylor & Zafman

[57] ABSTRACT

A read-only memory incorporated on a single substrate for use with a microprocessor system is described. The memory includes a transceiver for passing data and first address signals, and the transceiver has a first side for coupling to a first plurality of lines. A first latch for latching the first address signals is provided, wherein the first latch has a first side coupled to a second side of the transceiver. A first buffer is provided, the first buffer having a first side coupled to a second side of the first latch. A second buffer for buffering second address signals is provided, the second buffer having a first side for coupling to a second plurality of lines. A second latch for latching the second address signals is provided, wherein the second latch has a first side coupled to a second side of the second buffer. A third buffer is provided, and the third buffer has a first side coupled to a second side of the second latch. A memory array for storing the data is further provided. The read-only memory also includes an address decoder for decoding the first and second address signals for selecting data from the memory array, wherein th address decoder has (1) a first input coupled to a second side of the first buffr, (2) a second input coupled to a second side of the third buffer, and (3) an output coupled to the memory array. A fourth buffer for passing the data from the memory array to the transceiver is included. The fourth buffer has (1) an input coupled to an output of the memory array and (2) an output coupled to the second side of the transceiver. The read-only memory also includes an output buffer having (1) an input coupled to the second side of the first latch and (2) an output for providing latched address signals as an output from the read-only memory.

4 Claims, 4 Drawing Sheets

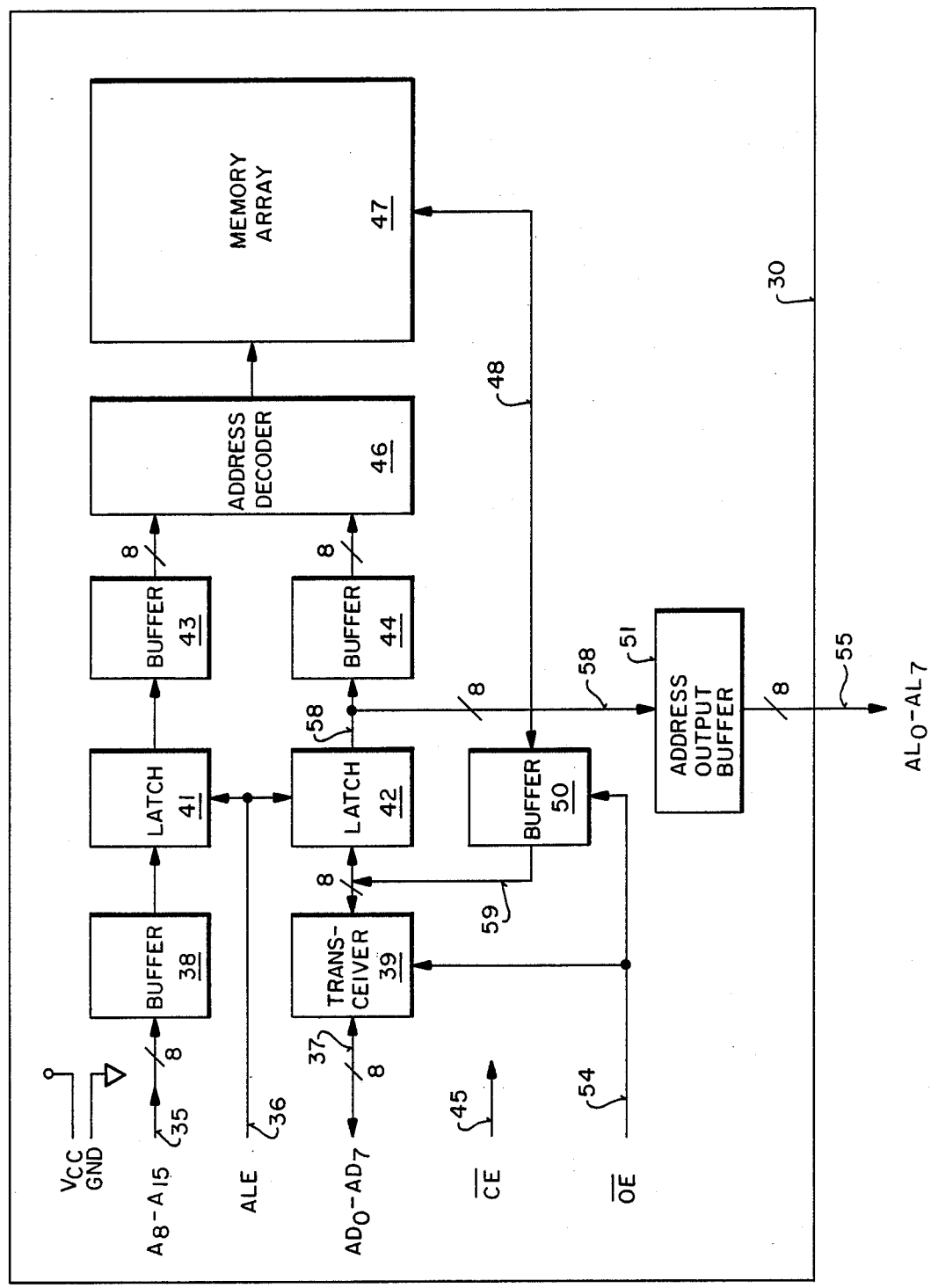

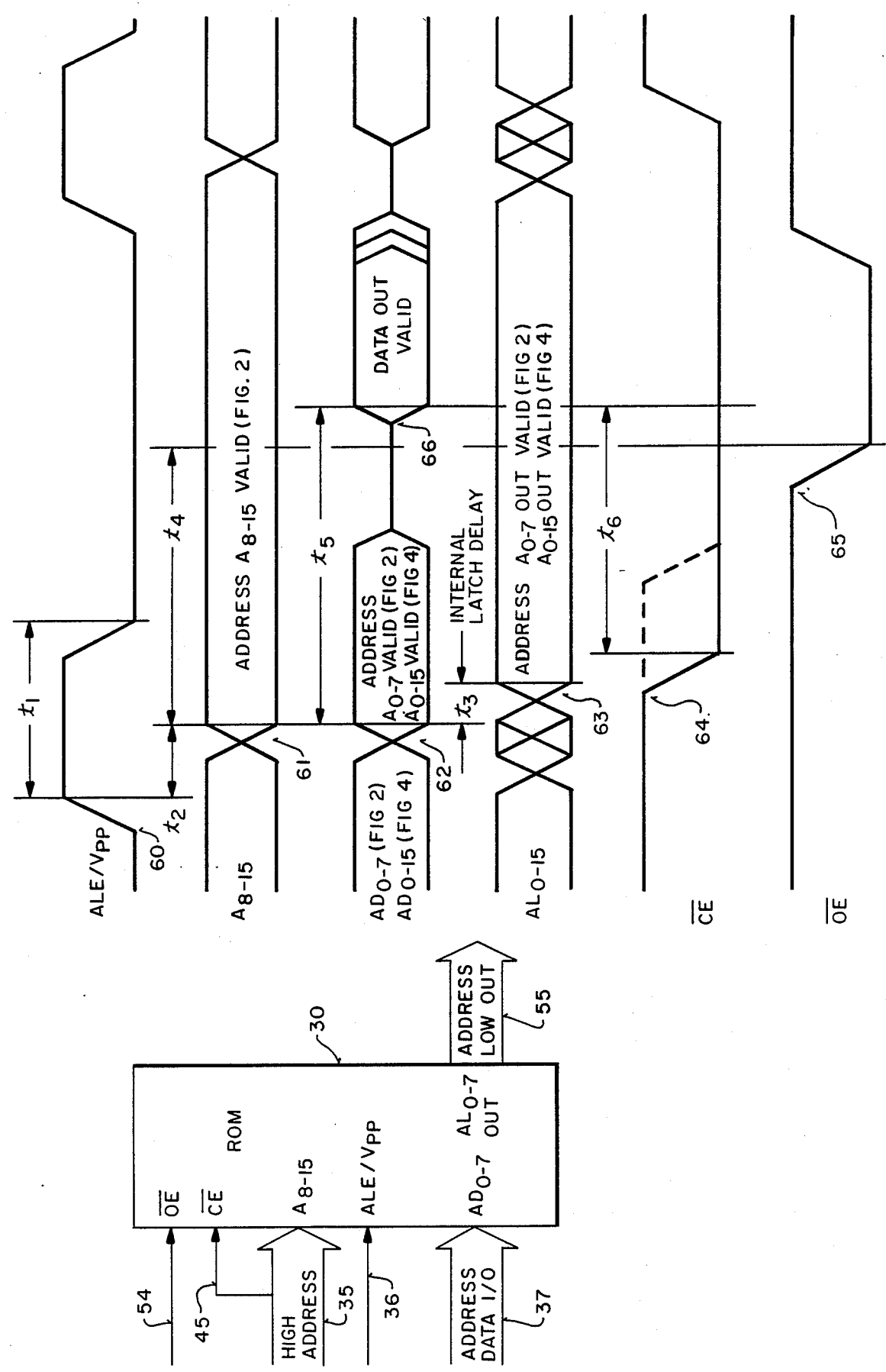

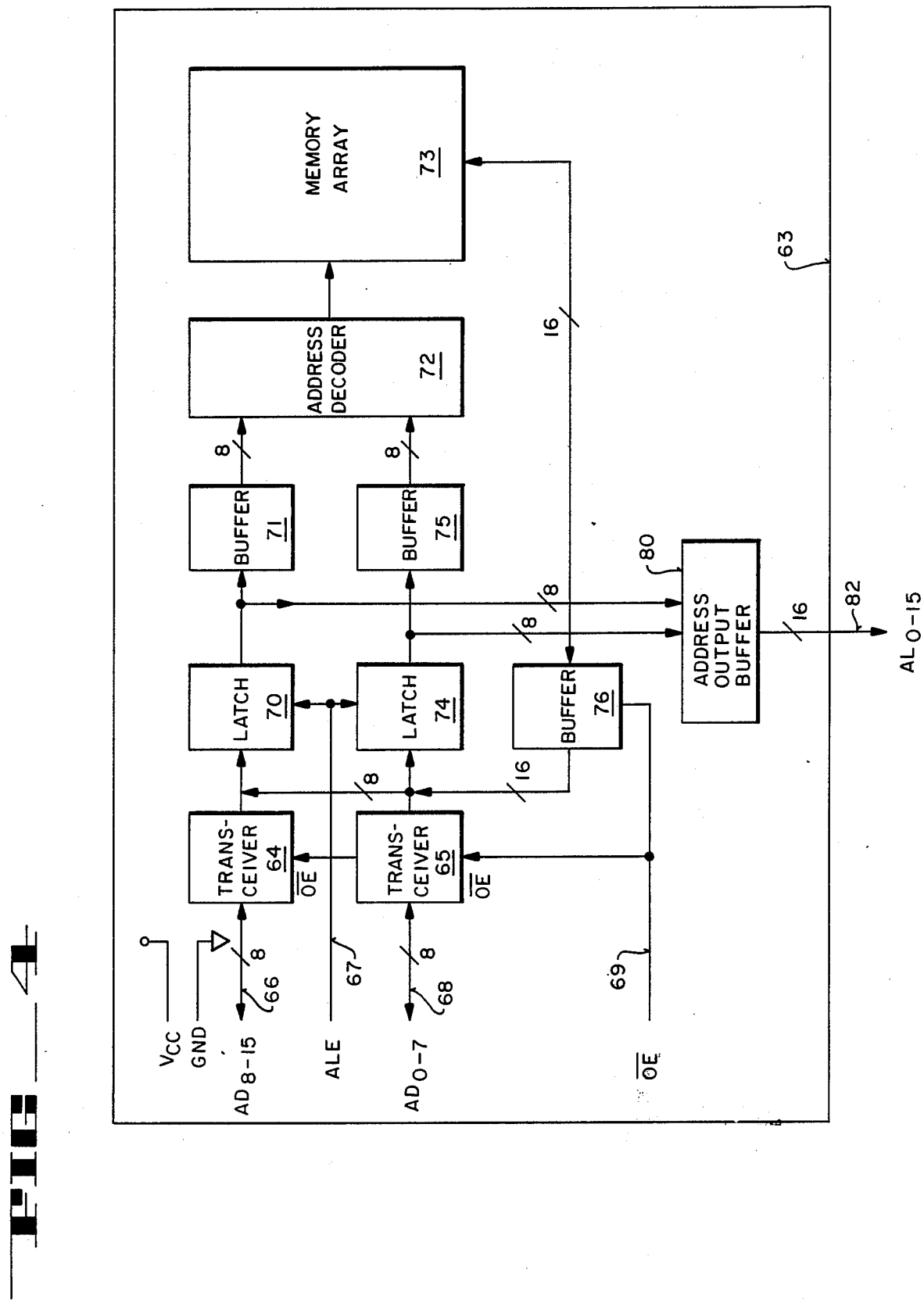
FIG_4

READ-ONLY MEMORY FOR MICROPROCESSOR SYSTEMS HAVING SHARED ADDRESS/DATA LINES

BACKGROUND OF THE INVENTION

1. Field of the Invention.

The invention relates to the field of semiconductor memories, more particularly to read-only memories.

2. Prior Art.

The present invention is directed to a read-only memory (ROM), more particularly to a memory used with a microprocessor where the microprocessor time-multiplexes addresses and data on a bus. One commercial embodiment of a system where the address/data lines are shared is in the Intel Multibus. Typically in these systems, address signals are latched in an external latch for use by circuits operating with the microprocessor such as RAM, ROM, I/O, ports, peripherals, etc. A more thorough discussion of the prior art as it relates to these microprocessor is described in conjunction with FIG. 1.

In the present invention, latches are incorporated within a ROM for storing address signals. The address signals are made available from the latch to other circuits operating with the microprocessors. Latches have been incorporated in memories including EPROMs, however, for different purposes.

In U.S. Pat. No. 4,545,038 (column 1, line 45 to column 2, line 15) a latch is described which stores data used for the programming of an electrically programmable read-only memory (EPROM). Other patents describing latches are U.S. Pat. Nos. 4,587,637, 4,610,004, 4,646,269, 4,691,298, 4,715,017, 4,725,945 and 4,460,982.

There are commercially available EPROMs which store address signals in internal latches, however, the addresses are only used for internal purposes. Products known to Applicant which employ these latches are Intel Part Nos. 87C257 and 87C64.

SUMMARY OF THE INVENTION

A read-only memory incorporated on a single substrate for use with a microprocessor system having a first plurality of lines that are shared for data and address signals is described. The memory includes an array for storing data and an address decoder coupled to the array for selecting data from the array. A latch is coupled to the first plurality of lines to receive address signals from the lines. The output of the latch is coupled to the address decoder. In an ordinary manner, the address signals select data from the array through the decoder. The data from the array is coupled to the first lines so that data may be coupled from the read-only memory. An output buffer is used with the EPROM; the buffer has its input coupled to the output of the latch. A plurality of second lines are coupled to the output of the output buffer and these lines provide the address signals as an output from the read-only memory.

Other aspects of the present invention are described in the following detailed description of the invention.

BRIEF DESCRIPTION OF THE DRAWINGS

FIG. 2 is a block diagram of one embodiment of the present invention.

FIG. 3a illustrates a memory incorporating the present invention and is used for purposes of identifying signals into and from the memory.

FIG. 3b illustrates waveforms associated with the memory of FIG. 3a.

FIG. 4 is a block diagram of another embodiment of the present invention.

DETAILED DESCRIPTION OF THE PRESENT INVENTION

Figure 1:
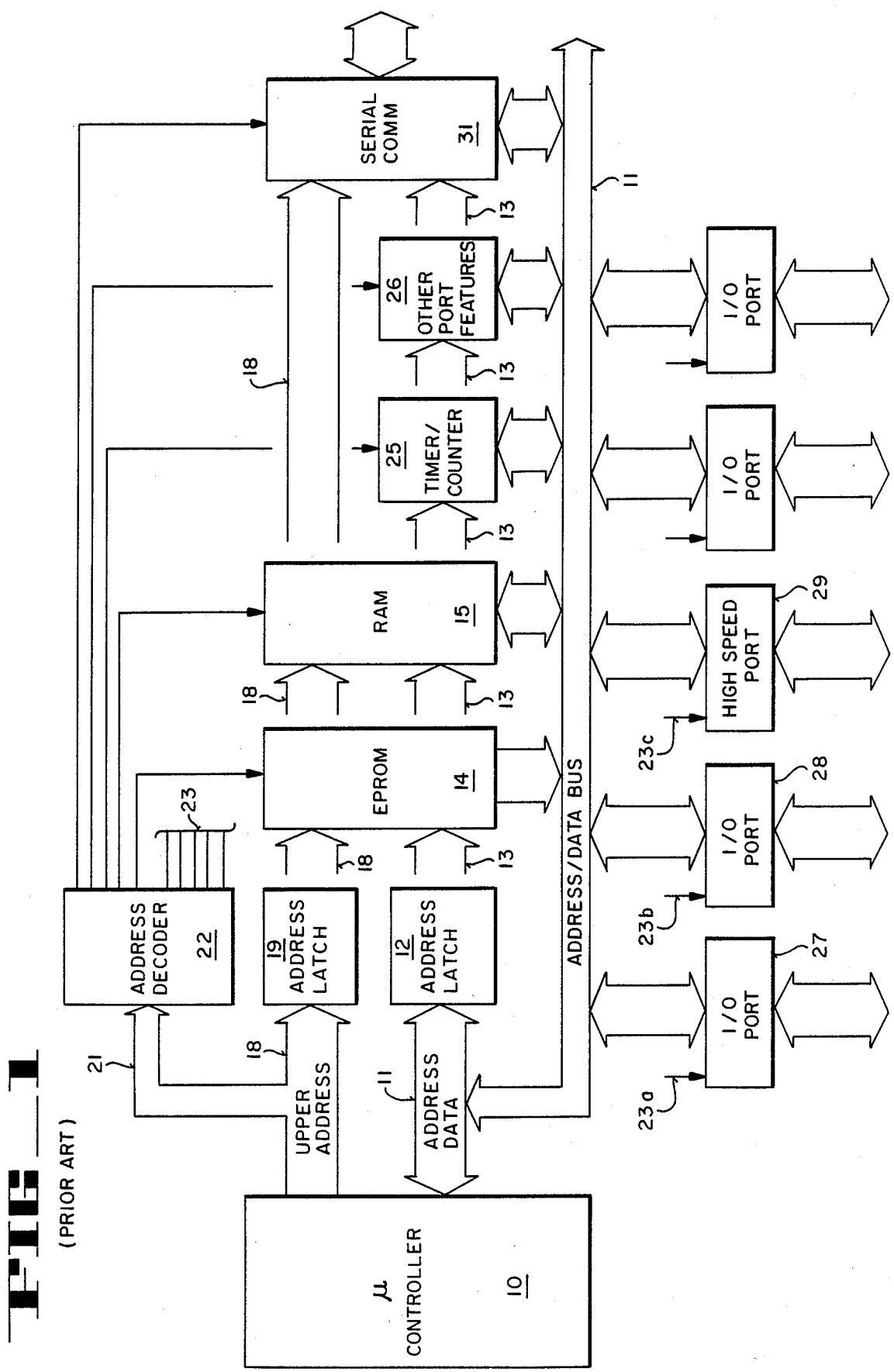
FIG. 1 is a block diagram illustrating a microprocessor with other integrated circuits which together form a prior art computer system. The computer system has a bus shared for address and data signals. This block diagram is used to describe the prior art and to illustrate the prior art integrated circuits eliminated by the present invention.

A read-only memory is described for use with a microprocessor system where the microprocessor employs lines shared for address and data signals. In the following description, numerous specific details are set forth such as specific number of lines in order to provide a thorough understanding of the present invention. It will be obvious, however, to one skilled in the art that the present invention may be used without these details. In other instances, well-known circuits are described in block diagram form in order not to unnecessarily obscure the present invention in detail.

Prior Art Computer of FIG. 1

In FIG. 1, a microcontroller or microprocessor 10 is shown which has two buses. One bus 11 includes a plurality of lines (e.g., 8 lines) which carry both address signals and data signals. These signals are time-multiplexed on the bus in a well-known manner. Typically, the bus 11 carries the lower address bits of an address. The second bus 18 coupled to the controller 10 transmits, for example, the upper 8 of bits an address. In some cases, some of these bits are connected to an address decoder 22 via lines 21. These address signals are decoded and used to control (e.g., enable) various circuits (and other circuit components such as ports) of the computer. For example, a chip enable signal is coupled to the EPROM 14 from the decoder 22 for enabling the EPROM. Other such signals are shown coupled to the RAM 15, time/counter 25, serial communications circuit 31, I/O ports 27, 28, and 29, other port features 26. (Lines 23a, 23b and 23c are coupled, for instance, to enables ports 27, 28 and 29, respectively.)

Some circuits such as the EPROM, RAM, etc., in addition to being coupled to bus 11, also receive address signals from an address latch 12 via the bus 13. The upper address signals are coupled to these circuits via the bus 18 from the address latch 19.

Typically, the microcontroller 10 provides an address which is latched by the two external integrated circuits, address latch 12 and address latch 19. Each latch effectively stores 8 bit address signals so that they can be coupled to the buses 13 and 18. The latches 12 and 19 free the microcontroller 10 and, for example, enable the address/data bus 11 to receive data over bus 11 while the latches 12 and 19 are providing address signals to circuits, ports, etc.

The present invention provides an improved ROM which will fulfill the function of the EPROM 14 in the circuit of FIG. 1 along with the functions provided by the address latches 12 and 19. Accordingly, the present invention has the advantage of eliminating two components and hence, reducing the costs and complexity of the computer system of FIG. 1.

Embodiment of FIG. 2

One of the currently preferred embodiments of the present invention is illustrated in FIG. 2. The entire circuit of FIG. 2 is incorporated on a single substrate or die 30 and can be fabricated using ordinary metal-oxide-semiconductor (MOS) or complementary MOS (CMOS) technology and well-known circuits. In the currently preferred embodiment, the invention is used in an electrically programmable read-only memory where each cell of the memory includes a floating gate memory device which stores charge in an electrically isolated conductive gate member, such as a polysilicon floating gate. A plurality of these memory cells are arranged in columns and rows in an ordinary manner in a memory array illustrated as memory array 47 in FIG. 2.

Cells are selected in the memory array 47 by an address decoder 46. This decoder operates in an ordinary manner. For example, upon receiving address signals (16 bits for the illustrated embodiment) during a read cycle, the decoder and array provide data on the lines 48. For purposes of discussion it is assumed that the memory array provides an 8 bit output for each address applied to the address decoder 46.

For the present invention, the upper address bits on lines 35 (corresponding to bus 18 of FIG. 1) are coupled to a buffer 38. The buffer 38 is connected to a latch 41. For the illustrated embodiment, the latch 41 stores the 8 bits ($A_8$–$A_{15}$) applied to the memory on lines 35 for use by the memory. Other components in the computer system receive these 8 bits from the processor. The output of the latch 41 is coupled through a buffer 43 to the address decoder 46 to provide the upper 8 bits of the address to the decoder 46.

The lower address bits and data bus lines 37 (corresponding to bus 11 of FIG. 1) are coupled to a transceiver 39. The output of the transceiver 39 is coupled to a latch 42. The latch 42 provides storage for 8 bits (i.e., signals $A_{D0}$–$A_{D7}$). The output of latch 42 is coupled to the address decoder 46 through a buffer 44.

The output from the latch 42 (lines 58) is coupled to an output buffer 51. The output of buffer 51 provides output address signals from the memory on lines 55 (signals $A_{L0}$–$A_{L7}$). When comparing the circuit of FIG. 2 to the prior art, lines 55 provide the address signals shown on bus 13 of FIG. 1.

The data from the memory array 47 is coupled to the buffer 50 on lines 48. The output of the buffer 50 (lines 59) is coupled to transceiver 39 allowing the data from the array to be coupled to the data lines 37 (corresponding to bus 11 of FIG. 1).

The address latch enable signal (ALE) on line 36 is coupled to latches 41 and 42 enabling these latches to receive the address signals from lines 35 and 37, respectively. Also an output enable (OE) signal on line 54 is coupled to the buffer 50 and to the transceiver 39 allowing the data from the array 47 to be gated onto lines 37.

A chip enable (CE) signal is coupled to the memory of FIG. 2 to enable the memory.

Waveforms Associated with the Embodiment of FIG. 2

The memory of FIG. 2 is again shown in a simpler form in FIG. 3A. The ROM 30 is shown coupled to: the bidirectional address/data lines 37; the lines 35 which provide the higher address signals; line 45 which provides the chip enable signal; line 54 which provides the output enable signal; and, line 36 which provides the address latch enable (alternately line 36 is used for the $V_{PP}$ potential during programming). The low address bits are provided from the memory on lines 55. The high address bits are provided by the microcontroller.

In FIG. 3B, the various waveforms associated with the ROM 30 of FIG. 3A are illustrated. Assume first that the microprocessor initiates a ROM read cycle. First, the ALE signal rises in potential for a period $t_1$ as indicated by waveform 60. This signal indicates that the latches should be enabled and that a valid address will be present on lines 35 and 37. After a period $t_2$, valid addresses are present on lines 35 and 37 and these addresses are latched within the ROM 30. The waveforms 61 and 62 indicate that valid waveforms are present from the microprocessor on the lines 35 and 37. After a period of time $t_3$ the addresses are latched within the ROM, and as indicated by the waveform 63, valid addresses are present from the ROM on the lines 55. These addresses remain valid throughout the remainder of the cycle. Assuming that data is to be read from the ROM 30, the chip enable signal which is active/low drops in potential as indicated by waveform 64. After a period of time illustrated as $t_6$, the addresses applied to the ROM are decoded and data is selected from the memory array 47 and made available on the lines 37 as indicated by waveform 66. The output enable signal is applied to the memory after a period $t_4$ measured from the time that the addresses become valid. The output enable signal is indicated by waveform 65. This signal is also active/low and hence, drops in potential to enable outputs from the memory.

During other cycles, for example, during a RAM cycle, the waveforms 60, 61, 62 and 63 remain as shown permitting the addresses stored within the ROM 30 to be used by other circuits or components such as the ports within the computer system even though data is not being read from the ROM.

Embodiment of FIG. 4

In some cases the microprocessor employs a 16 bit data/address bus. In this case, address signals and data signals are time-multiplexed on the 16 lines of the bus. In the prior art a latch or latches are used as discussed in conjunction with FIG. 1 to latch the 16 address bits. The present invention may be used to eliminate these latches with the embodiment shown in FIG. 4.

Again, the circuitry of the present invention is incorporated on a single substrate, shown as substrate 63 which substrate contains a read-only memory. The address/data bus is shown as two sets of lines in FIG. 4, lines 66 carrying the upper address and data bits $A_{D8}$–$A_{D15}$, and lines 68 carrying the lower address and data bits $A_{D0}$–$A_{D7}$. Lines 66 and 68 are coupled to transceivers 64 and 65, respectively. Transceiver 64 is coupled to latch 70 and transceiver 65 is coupled to latch 74. Address signals on the lines 66 and 68 are stored in the latches 70 and 74, respectively. The output of latch 70 is coupled to the address decoder 72 through buffer 71; the output of latch 74 is coupled to the decoder 72 through the buffer 75.

The decoder 72 selects data from the memory array 73 during a read cycles, and for the embodiment illustrated, a 16 bit word is selected from the array 73. The data from the array is coupled through the buffer 76 (when the buffer is enabled by the output enable signal on line 69) to lines 66 and 68 through transceivers 64 and 65, respectively.

The addresses latched in latches 70 and 74 are coupled to an address output buffer 80. The buffer 80 provides all 16 bits of the address on lines 82.

The embodiment of FIG. 4 operates in a manner similar to that described for the previous embodiment, that is the latches 70 and 74 are enabled by the signal on line 67. The addresses stored in the latches are provided on line 82 to circuits and other elements in the computer system even when the ROM is not enabled. For this embodiment, however, all 16 bits of the addresses are provided as an output from the memory.

Thus, an improved read-only memory has been described which includes internal latches which store address signals. The address signals are made available as an output from the EPROM for various circuits and components associated with a computer system.

What is claimed is:

1. A read-only memory incorporated on a single substrate for use with a microprocessor system, wherein the microprocessor system has (1) a first plurality of lines that are shared for data and first address signals and (2) a second plurality of lines that provide second address signals, comprising:
    a transceiver for passing the data and the first address signals, wherein the transceiver has a first side for coupling to the first plurality of lines;
    a first latch for latching the first address signals, wherein the first latch has a first side coupled to a second side of the transceiver;
    a first buffer with a first side coupled to a second side of the first latch;
    a second buffer for buffering the second address signals, wherein the second buffer has a first side for coupling to the second plurality of lines;
    a second latch for latching the second address signals, wherein the second latch has a first side coupled to a second side of the second buffer;
    a third buffer with a first side coupled to a second side of the second latch;
    a memory array for storing the data;
    an address decoder for decoding the first and second address signals for selecting the data from the memory array, wherein the address decoder has (1) a first input coupled to a second side of the first buffer, (2) a second input coupled to a second side of the third buffer, and (3) an output coupled to the memory array;
    a fourth buffer for passing the data from the memory array to the transceiver, wherein the fourth buffer has (1) an input coupled to an output of the memory array and (2) an output coupled to the second side of the transceiver;
    an output buffer having (1) an input coupled the second side of the first latch and (2) an output for providing latched address signals as an output from the read-only memory.

2. The read-only memory of claim 1, wherein the memory is an electrically programmable read-only memory.

3. A read-only memory receiver incorporated on a single substrate for use with a microprocessor system, wherein the microprocessor system has (1) a first plurality of lines that are shared for first data and first address signals and (2) a second plurality of lines that are shared for second data and second address signals, comprising:
    a first transceiver for passing the first data and the first address signals, wherein the first transceiver has a first side for coupling to the first plurality of lines;
    a first latch for latching the first address signals, wherein the first latch has a first side coupled to a second side of the first transceiver;
    a first buffer with a first side coupled to a second side of the first latch;
    a second transceiver for passing the second data and the second address signals, wherein the second transceiver has a first side for coupling to the second plurality of lines;
    a second latch for latching the second address signals, wherein the second latch has a first side coupled to second side of the second transceiver;
    a second buffer with a first side coupled to a second side of the second latch;
    a memory array for storing the first and second data;
    an address decoder for decoding the first and second address signals for selecting the first and second data from the memory array, wherein the address decoder has (1) a first input coupled to a second side of the first buffer, (2) a second input coupled to a second side of the second buffer, and (3) an output coupled to the memory array;
    a third buffer for passing the first data from the memory array to the first transceiver and for passing the second data from the memory array to the second transceiver, wherein the third buffer has (1) an input coupled to an output from the memory array, (2) first output lines coupled to the second side of the first transceiver, and (3) second output lines coupled to the second side of the second transceiver;
    an output buffer having (1) a first input coupled to the second side of the first latch, (2) a second input coupled to the second side of the second latch, and (3) an output for providing latched address signals as an output from the read-only memory.

4. The read-only memory of claim 3, wherein the memory is an electrically programmable read-only memory.

* * * * *

UNITED STATES PATENT AND TRADEMARK OFFICE
CERTIFICATE OF CORRECTION

PATENT NO.   :   4,939,692
DATED        :   July 3, 1990
INVENTOR(S)  :   Terry L. Kendall It is certified that error appears in the above-identified patent and that said Letters Patent is hereby corrected as shown below:

| | | |
|---|---|---|
| Abstract, Line 22 | delete "th" | insert --the-- |
| Abstract, Line 24 | delete "buffr" | insert --buffer-- |
| Col. 1, Line 19 | before "ports" | delete "," |
| Col. 2, Line 46 | before "other" | insert --and-- |
| Col. 4, Line 65 | delete "cycles," | insert --cycle,-- |
| Col. 6, Line 6 | before "incorporated" | delete "receiver" |

Signed and Sealed this

Twenty-second Day of June, 1993

Attest:

MICHAEL K. KIRK

Attesting Officer    Acting Commissioner of Patents and Trademarks